US008558396B2

(12) United States Patent
Kelkar et al.

(10) Patent No.: US 8,558,396 B2
(45) Date of Patent: Oct. 15, 2013

(54) BOND PAD CONFIGURATIONS FOR SEMICONDUCTOR DIES

(75) Inventors: Nikhil Vishwanath Kelkar, Saratoga, CA (US); Sagar Pushpala, Sunnyvale, CA (US); Seshasayee sS. Ankireddi, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 75 days.

(21) Appl. No.: 13/325,764

(22) Filed: Dec. 14, 2011

(65) Prior Publication Data

US 2013/0015592 A1    Jan. 17, 2013

Related U.S. Application Data

(60) Provisional application No. 61/506,870, filed on Jul. 12, 2011.

(51) Int. Cl.
*H01L 23/48*   (2006.01)
*H01L 23/52*   (2006.01)
*H01L 29/40*   (2006.01)

(52) U.S. Cl.
USPC .... 257/781; 257/678; 257/784; 257/E21.214; 257/E21.159; 257/E21.499; 257/E21.508; 257/E21.509; 257/E21.512; 257/E21.506; 257/E21.525

(58) Field of Classification Search
USPC ......... 257/781, 780, 784, 766, 779, 734, 678, 257/786, E21.214, E21.499, E21.508, 257/E21.509, E21.512, E21.506, E21.525
See application file for complete search history.

(56) References Cited

U.S. PATENT DOCUMENTS

| | | | |
|---|---|---|---|
| 5,300,815 A | 4/1994 | Rostoker | |
| 5,441,917 A * | 8/1995 | Rostoker et al. | ............. 438/612 |
| 5,565,385 A | 10/1996 | Rostoker et al. | |
| 5,635,424 A | 6/1997 | Rostoker et al. | |
| 5,891,745 A | 4/1999 | Dunaway et al. | |
| 2008/0182120 A1 | 7/2008 | Tan et al. | |

* cited by examiner

*Primary Examiner* — David Nhu
(74) *Attorney, Agent, or Firm* — Fogg & Powers LLC

(57) ABSTRACT

A semiconductor device is provided and includes a semiconductor die, and a plurality of bond pads having exposed surfaces arranged in an alternating interleaved pattern on the semiconductor die. Each of the surfaces of the bond pads have a first bond placement area that overlaps with a second bond placement area, with the first bond placement area having a major axis that is orthogonal to a major axis of the second bond placement area. A connecting bond is located at an intersection of the major axes of the first bond placement area and the second bond placement area on one or more of the bond pads.

19 Claims, 8 Drawing Sheets

BOND PAD CONFIGURATIONS FOR SEMICONDUCTOR DIES

This application claims the benefit of priority to U.S. Provisional Application No. 61/506,870, filed on Jul. 12, 2011, the disclosure of which is incorporated by reference.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
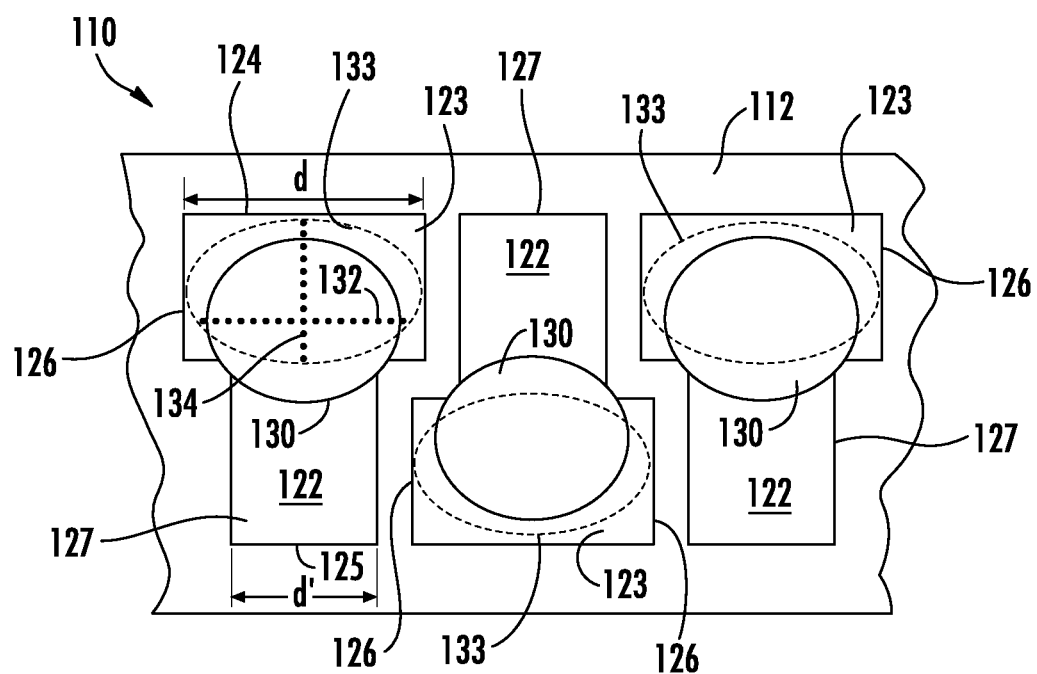
FIG. 1 is a top plan view of a section of a semiconductor die with a bond pad configuration according to one embodiment.

In the following detailed description, reference is made to the accompanying drawings that form a part hereof, and in which is shown by way of illustration specific illustrative embodiments. It is to be understood that other embodiments may be utilized and that logical, mechanical, and electrical changes may be made. The following detailed description is, therefore, not to be taken in a limiting sense.

Various bond pad configurations for a semiconductor die are provided. The bond pad configurations include a plurality of bond pads mounted on a surface of the die. The bond pads have various non-rectangular geometric shapes that allow placement of the bond pads in an interleaved arrangement, such that adjacent bond pads have alternating wider and narrower metal areas that are aligned with each other. The arrangement of bond pads with alternate wider and narrower metal areas allow for staggered placement of various connecting bonds on adjacent bond pads without risk of shorting the die.

The present bond pad configurations can be used with various chip connecting bond schemes. Exemplary connecting bonds include bond wires, bond ribbons, and bond clips, each having an end terminated by a ball, as well as wedge bonds. For convenience, these bonding schemes will be collectively referred to as "wire bonding" hereafter. Other connecting bonds that can be employed include stud bumps, such as copper stud bumps, which can be used in flip chip configurations.

The bond pad configurations provided in the present approach are useful in an ultrasonic wirebonding process, which is commonly employed in semiconductor device fabrication. In ultrasonic wirebonding, a bonding head is employed that includes a capillary held at an end of a horn, with a wire passed through the capillary. After a ball is formed at a tip end of the wire, the ball is bonded to a bond pad on a die. While bonding the wire to the bond pad, an ultrasonic oscillation produced by a transducer is outputted from the horn so that the capillary is caused to undergo ultrasonic vibration.

The present bond pad designs are particularly useful for copper wire bonding, where bond pad metal is displaced by the ultrasonic motion of the harder ball bond. The displacement of the metal is higher in the direction of capillary motion under ultrasonic actuation. The present approach provides a wire bond pad design layout that is independent of the axis of oscillation produced by the transducer. Each bond pad has two or more mutually exclusive areas for placement of a wire bond. The two or more mutually exclusive areas can also be used to place a pair of wire bonds and a probe mark. In addition, a narrower portion of the bond pad can be used for probing.

In one embodiment, an array of bond pads is provided in which each bond pad has two overlapping areas for bond placement. Each of the areas for bond placement has a major axis orthogonal to each other. During a bonding process, the major axis of each bond placement area is aligned with a direction of oscillating motion of a bond head.

In another embodiment, a semiconductor device comprises a plurality of bond pads arranged in an alternating interleaved pattern on a semiconductor die, with the bond pads each having an exposed surface with a geometric shape that includes a wider surface area and a narrower surface area. The bond pads each have a first bond placement area that overlaps with a second bond placement area, with the first bond placement area having a major axis that is orthogonal to a major axis of the second bond placement area. A wire bond is located in the wider surface area of each bond pad and is substantially centered at an intersection of the major axes of the first and second bond placement areas.

In a further embodiment, a bond pad array for a semiconductor device includes a plurality of bond pads each having an exposed surface with a geometric shape that has at least one pair of opposing parallel sides including a first side that is longer than an opposing second side. The bond pads each have a first bond placement area that overlaps with a second bond placement area on the exposed surface, with the first bond placement area having a major axis that is orthogonal to a major axis of the second bond placement area. The major axis of the first bond placement area is parallel with the first side and the major axis of the second bond placement area perpendicular to the second side. The first side is substantially equal to a dimension of a bond in a direction parallel to the oscillating motion of a bonding head and a safety zone around the bonding head. The second side is substantially equal to a dimension of the bond in a direction perpendicular to the oscillating motion of a bonding head and a safety zone around the bonding head. The safety zone allows for some error in placement of the bond wire, some error in the approach angle, and some variation in the shape or size of a contact footprint.

In a further embodiment, an array of bond pads is provided in which any pair of adjacent bond pads each have exposed surfaces with the same geometric shape and rotational symmetry with respect to each other, with each exposed surface having at most only one axis of symmetry.

In one approach, the bond pad exposed surface shapes can be produced by forming the metal of the bond pad surface into a desired geometric shape. Alternatively, a bond pad opening with a desired geometric shape can be formed in a passivation layer over the bond pad. While a bond pad can roughly match the shape of a bond pad opening, the bond pad may have other metal areas or traces connected to it as part of a circuit. Utilization of the passivation layer with openings allows a portion of the bond pad outside of the openings to be of any suitable size or shape.

In some embodiments, the geometric shapes of the bond pads and/or passivation openings for the bond pads have zero or one axis of symmetry, and no rotational symmetry. For example, a T-shape bond pad has one axis of symmetry, and an L-shape bond pad has no axis of symmetry. In other embodiments, the bond pads may have two or more mutually non-orthogonal axes of symmetry.

The present bond pad shapes and configurations allow for increased bond pad packing density on the surface of a die. The bond pad shapes and configurations also allow for smaller openings between the bond pads, while still providing enough space for pad metal displacement during fabrication.

The bond pad shapes and configurations also reduce the likelihood of pad-to-pad shorting on the die. For example, the bond pad designs prevent potential shorts between connecting bonds and adjacent bond pad metal, and prevent shorting between displaced pad metal and adjacent bond pads. Additional benefits include no latent leakage failure, and lower cost assembly due to relaxed wire bond placement tolerances.

Further details of various embodiments of the bond pad configuration are described hereafter with reference to the drawings.

FIG. 1 illustrates a section of a semiconductor die 110 with a bond pad configuration according to one embodiment. The bond pad configuration includes a plurality of bond pads 122 mounted on an upper surface 112 of a semiconductor die 110, which can be implemented as an integrated circuit.

Each of bond pads 122 has an exposed surface 123, which is configured in an interleaved arrangement with adjacent exposed surfaces. The exposed surface 123 is generally T-shaped and is defined by a pair of opposing parallel sides including a first side 124 that is longer than an opposing second side 125. The exposed surface 123 includes a wider surface area 126 and a narrower surface area 127. The wider surface area 126 of one bond pad is next to the narrower surface area 127 of an adjacent bond pad. Thus, adjacent bond pads 122 have 180 degree rotational symmetry with respect to each other, with each bond pad 122 positioned on die 110 such that its wider surface area 126 is rotated 180 degrees from the wider surface area 126 of an adjacent bond pad 122. This configuration allows for a staggered placement of a connecting bond 130 on wider surface area 126 of each bond pad 122. The T shape of exposed surface 123 provides wider spacing and/or an insulation barrier between displacement metal under each bond 130 and adjacent bond pads.

In one embodiment, first side 124 has a dimension d substantially equal to bond 130 in a direction parallel to the oscillating motion of a bonding head (dotted line 132) and a safety zone 133 around the bonding head. The second side 125 has a dimension d' that is substantially equal to a dimension of bond 130 in a direction perpendicular to the oscillating motion (dotted line 134) in safety zone 133.

Figure 2:
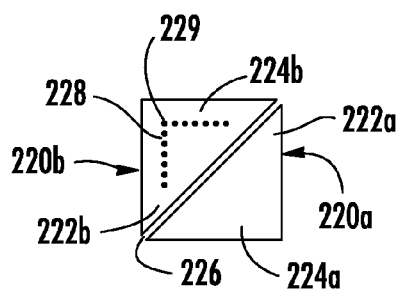
FIG. 2 illustrates three-sided design for bond pad surface shapes according to one embodiment.

FIG. 2 depicts a three-sided design for an exposed surface on each of a pair of adjacent bond pad 220a and 220b according to one embodiment. The bond pads 220a and 220b are configured such that a narrower surface area 222a of bond pad 220a is adjacent to a wider surface area 224b of bond pad 220b. Correspondingly, a narrower surface area 222b of bond pad 220b is adjacent to a wider surface area 224a of bond pad 220a. In this embodiment, the exposed surfaces of bond pads 220a and 220b have the shape of matching right triangles, which allows for placement in an interleaving pattern with a narrow gap 226 therebetween.

An L-shaped broken line 228 on bond pad 220b represents Ultrasonic Generator (USG) scrubbing directions that are utilized during a wire bonding process. A connecting bond can be located at a corner 229 of line 228, which results in a bond being placed in a part of bond pad 220b that has the largest distance from adjacent bond pad 220a while still being spaced away from the outside edge of bond pad 220b. A bond can also be placed at a similar location on bond pad 220a.

Figure 3:
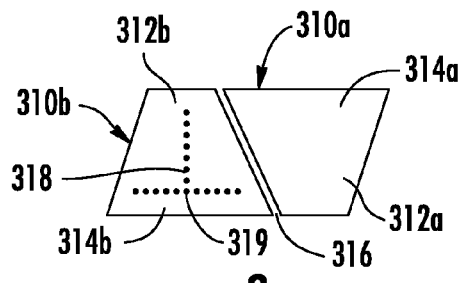
FIG. 3 shows a four-sided design for bond pad surface shapes according to one embodiment.

FIG. 3 illustrates a four-sided, trapezoidal design for a pair of adjacent bond pads 310a and 310b according to another embodiment. The bond pads 310a and 310b are configured such that a narrower surface area 312a of bond pad 310a is adjacent to a wider surface area 314b of bond pad 310b. Correspondingly, a narrower surface area 312b of bond pad 310b is adjacent to a wider surface area 314a of bond pad 310a. In this embodiment, the bond pads 310a and 310b have the same trapezoidal shape, which allows the bond pads to be configured in an interleaving pattern with a narrow gap 316 therebetween. A T-shaped broken line 318 on bond pad 310b represents USG scrubbing directions used during a wire bonding process. A connecting bond can be located at a corner 319 of line 318, which results in a bond being placed in a part of bond pad 310b that has the largest distance from adjacent bond pad 310a while still being spaced away from the outside edge of bond pad 310b. A bond can also be placed at a similar location on bond pad 310a.

Figure 4:
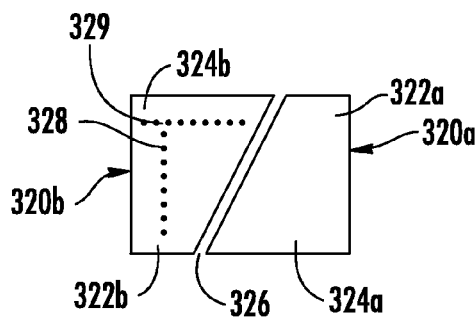
FIG. 4 depicts a four-sided design for bond pad surface shapes according to another embodiment.

FIG. 4 shows a four-sided, trapezoidal design for a pair of adjacent bond pads 320a and 320b according to an alternative embodiment. The bond pads 320a and 320b are configured such that a narrower surface area 322a of bond pad 320a is adjacent to a wider surface area 324b of bond pad 320b. Correspondingly, a narrower surface area 322b of bond pad 320b is adjacent to a wider surface area 324a of bond pad 320a. In this embodiment, bond pads 320a and 320b are shaped in the form of matching trapezoids each having two right angles, which allows the bond pads to be configured in an interleaving pattern with a narrow gap 326 therebetween. A broken line 328 on bond pad 320b represents USG scrubbing directions utilized during a wire bonding process. A connecting bond can be located at a corner 329 of line 328, which results in a bond being placed in a part of bond pad 320b that has the largest distance from adjacent bond pad 320a while still being spaced away from the outside edge of bond pad 320b. A bond can also be placed at a similar location on bond pad 320a.

Figure 5A:
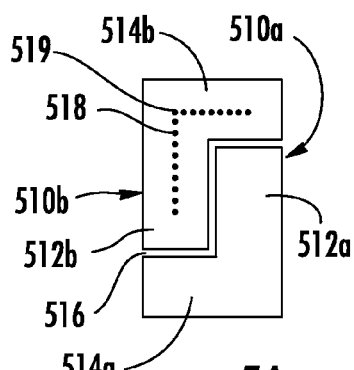
FIGS. 5A and 5B show six-sided designs for bond pad surface shapes according to alternative embodiments.

FIG. 5A illustrates a six-sided, L-shaped design for a pair of adjacent bond pads 510a and 510b according to another embodiment. The bond pads 510a and 510b are configured such that a narrower surface area 512a of bond pad 510a is adjacent to a wider surface area 514b of bond pad 510b. Correspondingly, a narrower surface area 512b of bond pad 510b is adjacent to a wider surface area 514a of bond pad 510a. In this embodiment, bond pads 510a and 510b have the same L-shaped design, which allows the bond pads to be configured in an interleaving pattern with a narrow gap 516 therebetween. A broken line 518 on bond pad 510b represents USG scrubbing directions utilized during a wire bonding process. A connecting bond can be located at a corner 519 of line 518, which results in a bond being placed in a part of bond pad 510b that is furthest from adjacent bond pad 510a while still being spaced away from the outside edge of bond pad 510b. A bond can also be placed at a similar location on bond pad 510a.

Figure 5B:
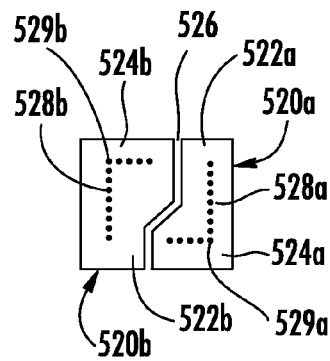
Figure 6:
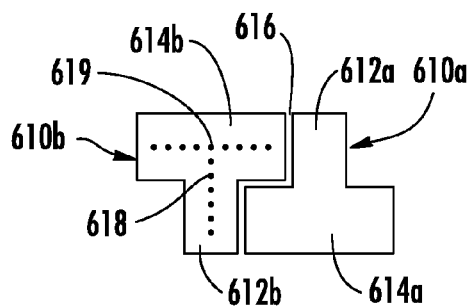
FIG. 6 depicts an eight-sided design for bond pad shapes according to one embodiment.

FIG. 5B shows a six-sided, modified L-shaped design for a pair of adjacent bond pads 520a and 520b according to an alternative embodiment. The bond pads 520a and 520b are configured such that a narrower surface area 522a of bond pad 520a is adjacent to a wider surface area 524b of bond pad 520b. Correspondingly, a narrower surface area 522b of bond pad 520b is adjacent to a wider surface area 524a of bond pad 520a. In this embodiment, bond pads 520a and 520b have the same modified L-shaped design, which allows the bond pads to be configured in an interleaving pattern with a narrow gap 526 therebetween. The broken lines 528a and 528b on bond pads 520a and 520b represent USG scrubbing directions utilized during a wire bonding process. A connecting bond can be located at respective corners 529b and 528a of line 528b and 528a, FIG. 6 illustrates an eight-sided, T-shaped design for a pair of adjacent bond pads 610a and 610b according to another embodiment. The bond pads 610a and 610b are configured such that a narrower surface area 612a of bond pad 610a is adjacent to a wider surface area 614b of bond pad 610b. Correspondingly, a narrower surface area 612b of bond pad 610b is adjacent to a wider surface area 614a of bond pad 610a. In this embodiment, bond pads 610a and 610b have the same shape, which allows the bond pads to be configured in an interleaving pattern with a narrow gap 616 therebetween. A broken line 618 on bond pad 610b represents USG scrubbing directions utilized during a wire bonding process. A bond can be located at a corner 619 of line 618, which results in a bond being placed in a part of bond pad 610b that is furthest from adjacent bond pad 610a. A bond can also be placed at a similar location on bond pad 610a.

FIGS. 7-10 illustrate various bond pad configurations for placement on a die.

Figure 7A:
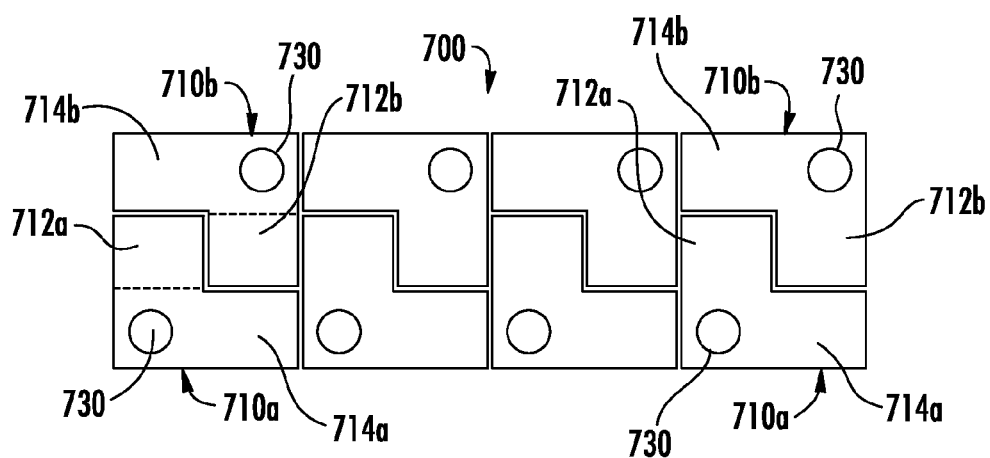
FIG. 7A shows a bond pad configuration for a plurality of matching L-shaped bond pads surfaces according to one embodiment.

FIG. 7A shows a bond pad configuration 700 for a plurality of matching L-shaped pairs of bond pads 710a and 710b according to one embodiment. The bond pads 710a and 710b are configured such that a narrower surface area 712a of bond pad 710a is adjacent to a wider surface area 714b of bond pad 710b. Correspondingly, a narrower surface area 712b of bond pad 710b is adjacent to a wider surface area 714a of bond pad 710a. The configuration of bond pads 710a and 710b allows for a staggered placement of connecting bonds 730 on wider surface areas 714a and 714b on bond pads 710a and 710b, respectively. Each pair of bond pads 710a and 710b are also arranged to have 180 degree rotational symmetry with respect to each other.

Figure 7B:
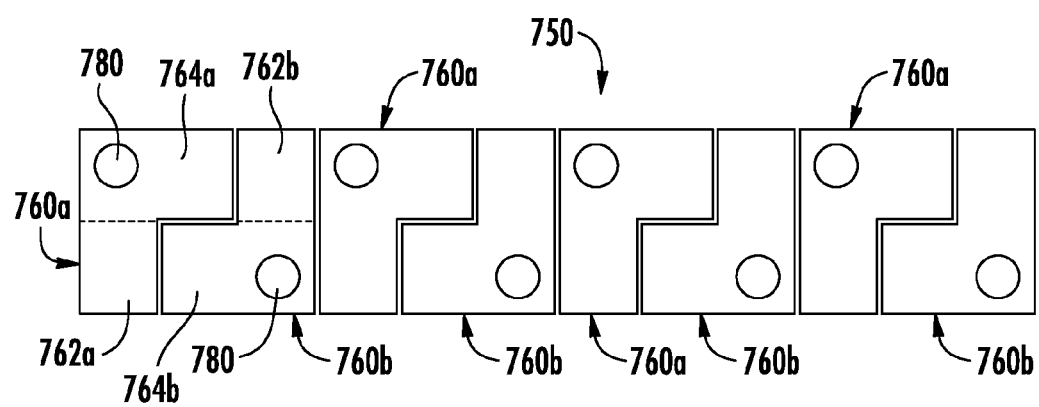
FIG. 7B depicts a bond pad configuration for a plurality of matching L-shaped bond pad surfaces according to another embodiment.

FIG. 7B shows a bond pad configuration 750 for a plurality of matching L-shaped pairs of bond pads 760a and 760b according to another embodiment. The bond pads 760a and 760b are configured such that a narrower surface area 762a of bond pad 760a is next to a wider surface area 764b of bond pad 760b. Correspondingly, a narrower surface area 762b of bond pad 760b is adjacent to a wider surface area 764a of bond pad 760a. The configuration of bond pads 760a and 760b allows for a staggered placement of connecting bonds 780 on wider surface areas 764a and 764b on bond pads 760a and 760b, respectively. Adjacent pairs of bond pads 760a and 760b are also arranged to have 180 degree rotational symmetry with respect to each other.

Figure 8:
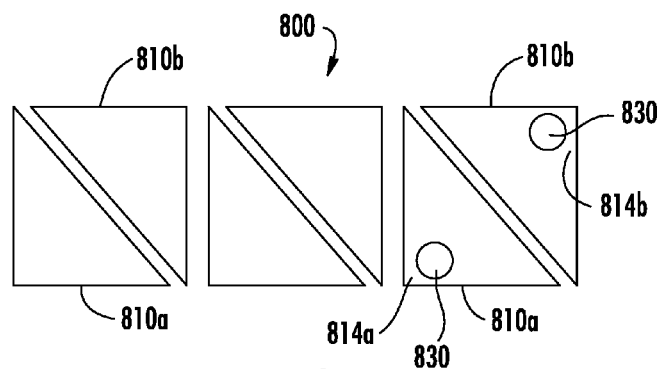
FIG. 8 depicts a bond pad configuration for a plurality of matching triangular-shaped bond pads according to another embodiment.

FIG. 8 depicts a bond pad configuration 800 for a plurality of matching triangular-shaped pairs of bond pads 810a and 810b according to another embodiment. The configuration of bond pads 810a and 810b allows for a staggered placement of connecting bonds on wider surface areas 814a and 814b on of each bond pads 810a and 810b, respectively. The bond pads 810a and 810b are arranged to have 180 degree rotational symmetry with respect to each other.

Figure 9:
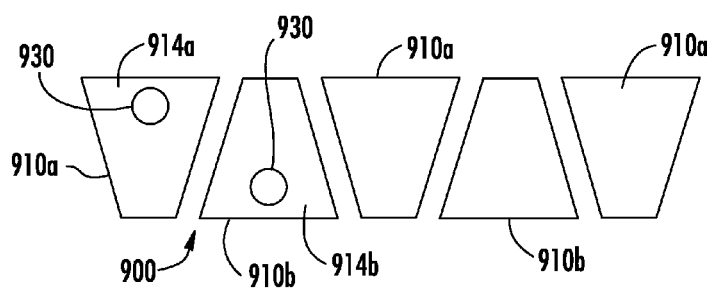
FIG. 9 shows a bond pad configuration for a plurality of matching trapezoid-shaped bond pads according to another embodiment.

FIG. 9 shows a bond pad configuration 900 for a plurality of matching trapezoid-shaped bond pads 910a and 910b according to another embodiment. The configuration of bond pads 910a and 910b allows for a staggered placement of connecting bonds on wider surface area 914a and 914b of bond pads 910a and 910b, respectively. The bond pads 910a and 910b are arranged to have 180 degree rotational symmetry with respect to each other.

Figure 10:
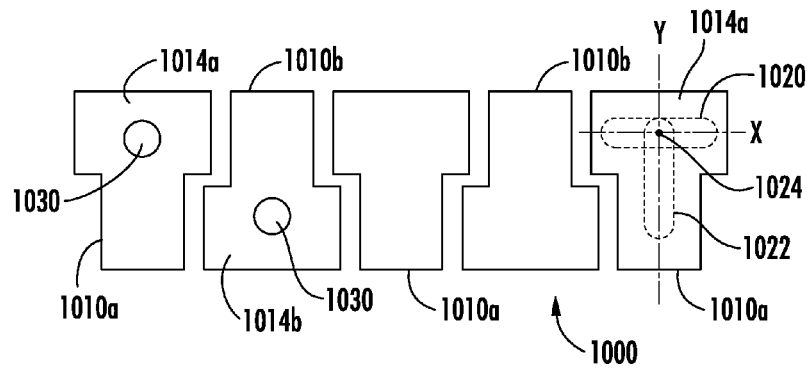
FIG. 10 illustrates a bond pad configuration for a plurality of matching T-shaped bond pads according to a further embodiment.

FIG. 10 illustrates a bond pad configuration 1000 for a plurality of matching T-shaped bond pads 1010a and 1010b according to a further embodiment. The configuration of bond pads 1010a and 1010b allows for a staggered placement of connecting bonds on wider surface areas 1014a and 1014b of bond pads 1010a and 1010b, respectively. The bond pads 1010a and 1010b are arranged to have 180 degree rotational symmetry with respect to each other.

The bond pad 1010a at the far right of FIG. 10 further illustrates two overlapping bond placement areas 1020 and 1022. The bond placement area 1020 has a major axis X that is orthogonal to a major axis Y of bond placement area 1022. A connecting bond can be coupled in wider surface area 1014a of the bond pad at an intersection 1024 of the major axes X and Y.

Figure 11:
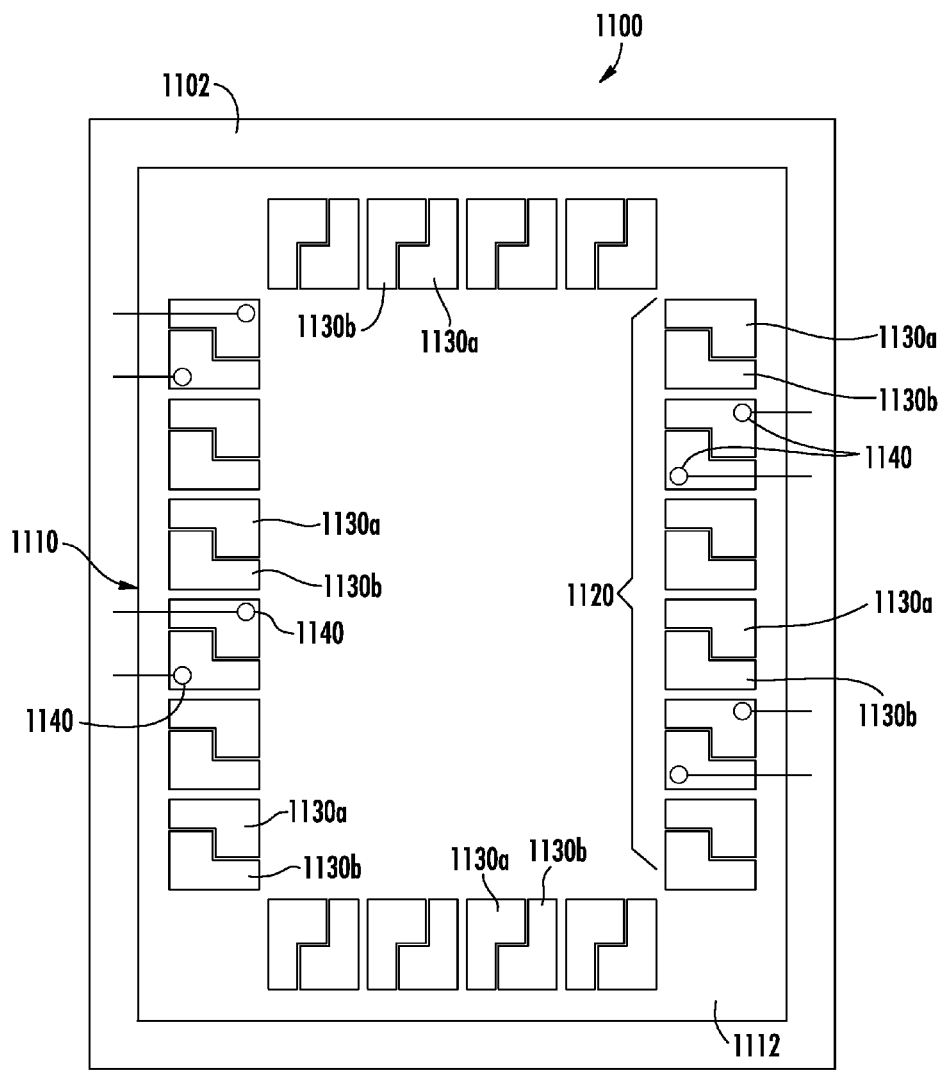
FIG. 11 illustrates an exemplary bond pad overlay on a die in an electronic system according to one embodiment.

FIG. 11 illustrates an exemplary bond pad overlay on a die in an electronic system 1100 according to one embodiment. The electronic system 1100 includes at least one die 1110 mounted on a substrate 1102 such as a printed circuit board. A bond pad configuration 1120 is formed on an upper surface 1112 of die 1110. The bond pad configuration 1120 includes a plurality of matching bond pad pairs 1130a and 1130b mounted around the outer periphery of die 1110. Each of bond pads 1130a and 1130b has an "L" shape, with each bond pad 1130a placed in an interleaved arrangement with a corresponding bond pad 1130b. This configuration of bond pads 1130a and 1130b allows for a staggered placement of a plurality of connecting bonds 1140 on the bond pads, thereby preventing pad to pad shorting in die 1110. The connecting bonds 1140 provide electrical connections between die 1110 and other electronic structures on substrate 1102.

In alternative embodiments, the bond pads 1130a and 1130b can have other geometric shapes such as those discussed previously.

Figure 12A:
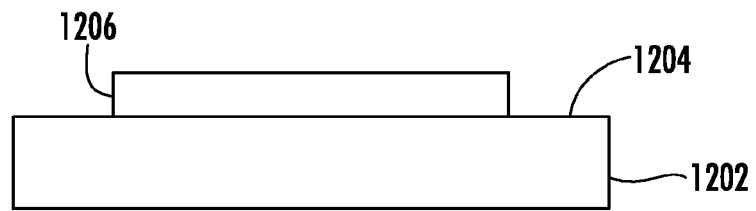
FIGS. 12A-12C show an exemplary method for fabricating an electronic device with a bond pad overlay according to one embodiment.
Figure 12B:
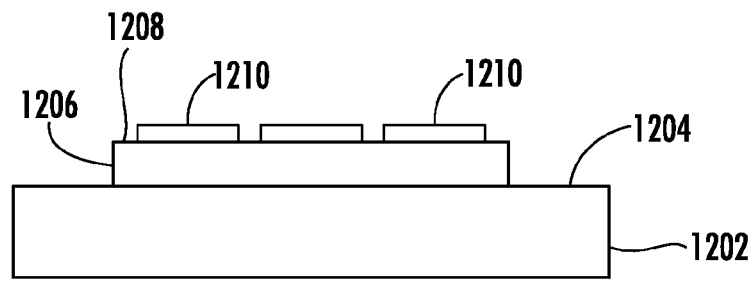
Figure 12C:
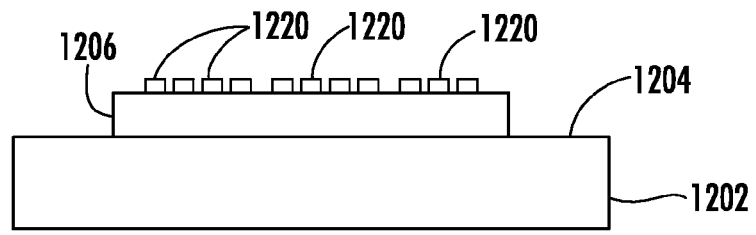

In the foregoing embodiments, the bond pads can be formed by depositing one or more metal layers on a surface of the die, and forming the metal layers into bond pads with the desired non-rectangular geometric shape. FIGS. 12A-12C show an exemplary method for fabricating an electronic device with such bond pads.

As depicted in FIG. 12A, a substrate 1202 has an upper surface 1204 to which a die 1206 is mounted. As shown in FIG. 12B, one or more metal layers 1210 are formed on an upper surface 1208 of die 1206 such as by conventional metal deposition techniques. The metal layers 1210 are formed into a plurality of bond pads 1220 having a desired geometric shape, as shown in FIG. 12C, such as by etching.

Alternatively, the bond pads can be formed by depositing one or more metal layers on a surface of the die, forming a passivation layer over the deposited metal layers, and forming openings in the passivation layer, with the openings corresponding to a desired geometric shape of the bond pads. FIGS. 13A-13E show an exemplary method for fabricating an electronic device with such bond pads.

Figure 13A:
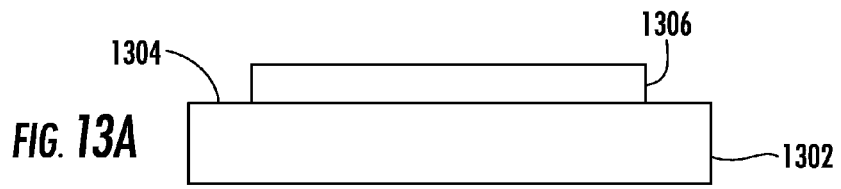
FIGS. 13A-13E show an exemplary method for fabricating an electronic device with a bond pad overlay according to another embodiment.
Figure 13B:
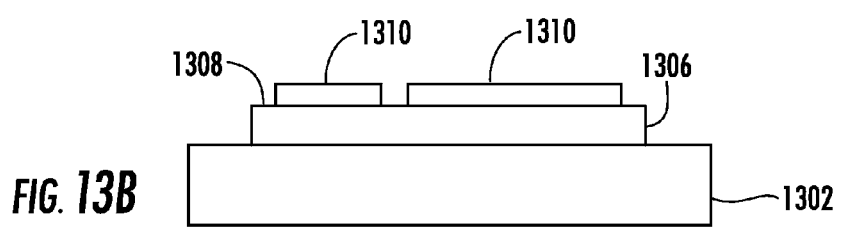
Figure 13C:
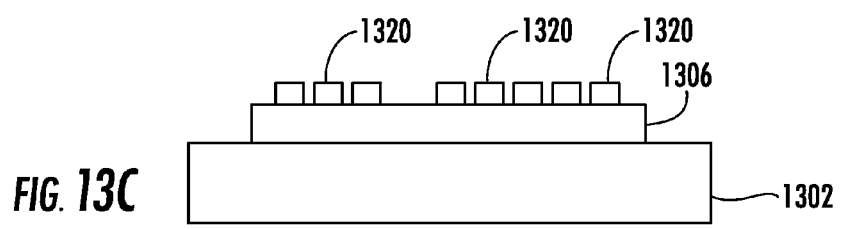
Figure 13D:
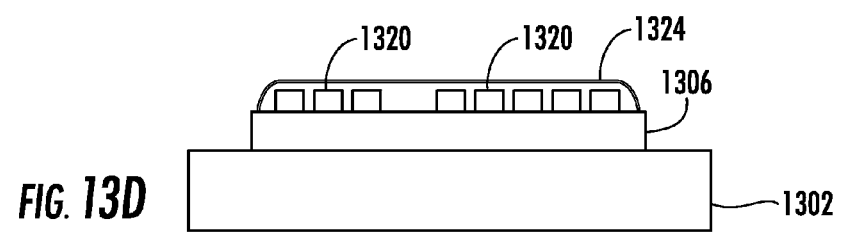
Figure 13E:
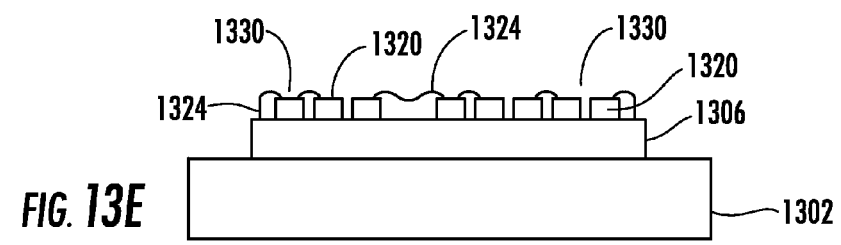

As depicted in FIG. 13A, a substrate 1302 has an upper surface 1304 to which a die 1306 is mounted. As shown in FIG. 13B, one or more metal layers 1310 are formed on an upper surface 1308 of die 1306. The metal layers 1310 are formed into a plurality of bond pads 1320, as shown in FIG. 13C. A passivation layer 1324 is then deposited over bond pads 1320 as depicted in FIG. 13D. As illustrated in FIG. 13E, a plurality of openings 1330 is then formed in passivation layer 1324 over bond pads 1320, with each of the openings formed to have a desired non-rectangular geometric shape such that exposed areas of the bond pads correspond to the geometric shape of the openings.

Figure 14:
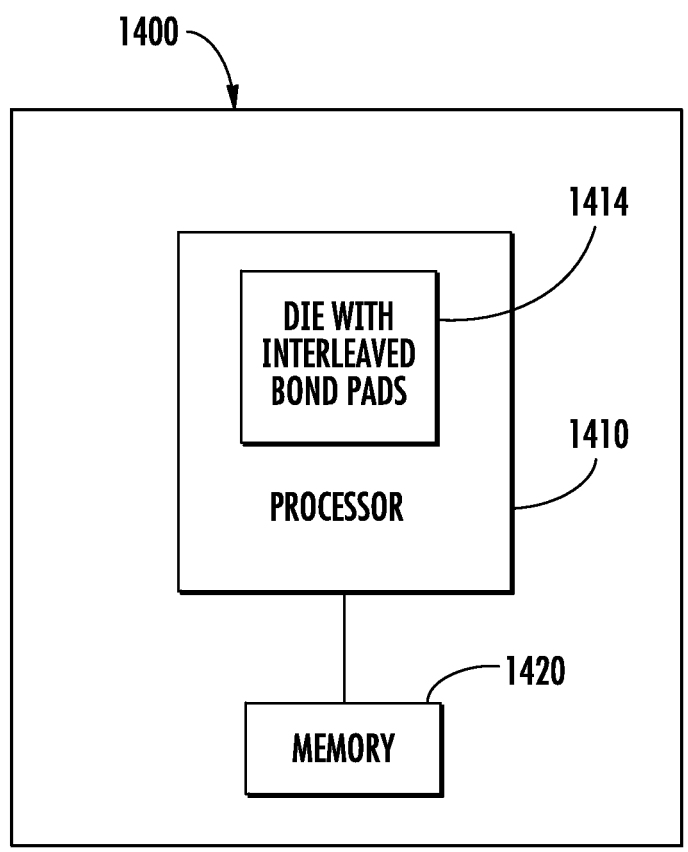
FIG. 14 is a block diagram of an electronic system according to one embodiment implemented with at least one semiconductor die having interleaved bond pads.

FIG. 14 is a block diagram of an electronic system 1400 that can be implemented with one or more semiconductor dies that utilize interleaved bond pads. The electronic system 1400 includes at least one processor 1410 operatively coupled to at least one memory device 1420. The processor 1410 is implemented with at least one semiconductor die 1414 having interleaved bond pads, such as any of the bond pad configurations described previously with respect to the drawings.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A semiconductor device, comprising:
   a semiconductor die;
   a plurality of bond pads having exposed surfaces arranged in an alternating interleaved pattern on the semiconductor die, each of the surfaces of the bond pads having a first bond placement area that overlaps with a second bond placement area, the first bond placement area having a major axis that is orthogonal to a major axis of the second bond placement area; and
   a connecting bond located at an intersection of the major axis of the first bond placement area and the major axis of the second bond placement area on one or more of the bond pads.

2. The semiconductor device of claim 1, wherein the exposed surfaces of the bond pads each have one of a triangular shape, a trapezoidal shape, an L shape, or a T shape.

3. The semiconductor device of claim 2, wherein the exposed surfaces of the bond pads all have the same geometric shape.

4. The semiconductor device of claim 3, wherein adjacent exposed surfaces of the bond pads are arranged to have 180 degree rotational symmetry with respect to each other.

5. The semiconductor device of claim 1, wherein the exposed surfaces of the bond pads are defined by openings in a passivation layer over the bond pads.

6. The semiconductor device of claim 1, wherein the connecting bond is selected from the group consisting of a bond wire, a bond ribbon, a bond clip, a stud bump, and a wedge bond.

7. A bond pad array for a semiconductor device, comprising:
   a plurality of bond pads each having an exposed surface with a geometric shape that has at least one pair of opposing parallel sides including a first side that is longer than an opposing second side, the bond pads each having a first bond placement area that overlaps with a second bond placement area on the exposed surface, the first bond placement area having a major axis that is orthogonal to a major axis of the second bond placement area, the major axis of the first bond placement area parallel with the first side and the major axis of the second bond placement area perpendicular to the second side;
   wherein the first side is substantially equal to a dimension of a bond in a direction parallel to the oscillating motion of a bonding head and a safety zone around the bonding head, and the second side is substantially equal to a dimension of the bond in a direction perpendicular to the oscillating motion of a bonding head and the safety zone; and
   wherein any pair of adjacent bond pads has exposed surfaces with the same geometric shape and rotational symmetry with respect to each other, each exposed surface having only one axis of symmetry.

8. The bond pad array of claim 7, wherein the exposed surfaces of the bond pads each have one of a triangular shape, a trapezoidal shape, an L shape, or a T shape.

9. The bond pad array of claim 7, wherein the exposed surfaces of the bond pads each have three sides, six sides, or eight sides.

10. The bond pad array of claim 7, wherein the exposed surfaces of the bond pads all have the same geometric shape.

11. The bond pad array of claim 7, wherein adjacent exposed surfaces of the bond pads are arranged to have 180 degree rotational symmetry with respect to each other.

12. The bond pad array of claim 7, wherein the exposed surfaces of the bond pads are defined by openings in a passivation layer over the bond pads.

13. An electronic system, comprising:
   an integrated circuit comprising:
      a plurality of bond pads around an outer periphery of a die, the bond pads each having an exposed surface with the same non-rectangular geometric shape and rotational symmetry, the exposed surface of each of the bond pads having a first bond placement area that overlaps with a second bond placement area, the first bond placement area having a major axis that is orthogonal to a major axis of the second bond placement area; and
      a bond located at an intersection of the major axis of the first bond placement area and the major axis of the second bond placement area on one or more bond pads;
      wherein the exposed surfaces have an alternating interleaved pattern such that the bonds are arranged in a staggered configuration on the die; and
   one or more electronic components coupled to the integrated circuit.

14. The electronic system of claim 13, wherein the exposed surfaces of the bond pads each have one of a triangular shape, a trapezoidal shape, a T shape, or an L shape.

15. The electronic system of claim 13, wherein each bond is located on a part of a respective bond pad that is furthest from an adjacent bond pad while still being spaced away from an outside edge of the respective bond pad.

16. A method of fabricating an integrated circuit, the method comprising:
   providing a semiconductor substrate;
   depositing one or more metal layers on the semiconductor substrate; and
   forming the one or more metal layers into a plurality of bond pads such that any pair of adjacent bond pads have surfaces with the same geometric shape and rotational symmetry with respect to each other, each of the surfaces of the bond pads having a first bond placement area that overlaps with a second bond placement area, the first bond placement area having a major axis that is orthogonal to a major axis of the second bond placement area.

17. The method of fabricating an integrated circuit according to claim 16, wherein the bond pads are formed by etching the metal layers to form the surfaces of the bond pads with a non-rectangular geometric shape.

18. The method of fabricating an integrated circuit according to claim 16, further comprising:
   depositing a passivation layer over the bond pads; and
   forming a plurality of openings in the passivation layer over the bond pads to expose the surfaces of the bond pads, the openings having a non-rectangular geometric shape.

19. The method of fabricating an integrated circuit according to claim 16, wherein the surfaces of the bond pads are formed to have at least one pair of opposing parallel sides including a first side that is longer than an opposing second side, the major axis of the first bond placement area parallel with the first side and the major axis of the second bond placement area perpendicular to the second side.

* * * * *